United States Patent
Grodzki et al.

(10) Patent No.: US 9,945,920 B2
(45) Date of Patent: *Apr. 17, 2018

(54) METHOD AND APPARATUS FOR OPTIMIZING A MAGNETIC RESONANCE SEQUENCE

(71) Applicant: Siemens Aktiengesellschaft, München (DE)

(72) Inventors: David Grodzki, Erlangen (DE); Björn Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 373 days.

This patent is subject to a terminal disclaimer.

(21) Appl. No.: 14/638,201

(22) Filed: Mar. 4, 2015

(65) Prior Publication Data

US 2015/0253405 A1    Sep. 10, 2015

(30) Foreign Application Priority Data

Mar. 4, 2014    (DE) ........................ 10 2014 203 867

(51) Int. Cl.
| | |
|---|---|
| *G01R 33/54* | (2006.01) |
| *G01R 33/30* | (2006.01) |
| *G01R 33/34* | (2006.01) |
| *G01R 33/385* | (2006.01) |
| *G01R 33/50* | (2006.01) |
| *G01R 33/565* | (2006.01) |

(52) U.S. Cl.
CPC ......... *G01R 33/546* (2013.01); *G01R 33/307* (2013.01); *G01R 33/34* (2013.01); *G01R 33/3852* (2013.01); *G01R 33/50* (2013.01); *G01R 33/543* (2013.01); *G01R 33/3854* (2013.01); *G01R 33/56509* (2013.01)

(58) Field of Classification Search
None
See application file for complete search history.

(56) References Cited

U.S. PATENT DOCUMENTS

| | | | |
|---|---|---|---|
| 5,758,646 A | * | 6/1998 | Van Der Meulen ... G01R 33/54 324/309 |
| 6,566,877 B1 | | 5/2003 | Anand et al. |

(Continued)

OTHER PUBLICATIONS

Li et al, "Optimal pulse design in quantum control: a unified computation method", PNAS, vol. 108, No. 5, Published Feb. 1, 2011.*

*Primary Examiner* — Melissa Koval
*Assistant Examiner* — Felicia Farrow
(74) *Attorney, Agent, or Firm* — Schiff Hardin LLP

(57) ABSTRACT

In a method for optimizing a magnetic resonance sequence of a magnetic resonance apparatus, a magnetic resonance sequence is provided to a computer, the sequence having a number of fixed point time intervals that are to be left unmodified, and a number of modifiable time intervals which may be optimized. The magnetic resonance sequence is automatically analyzed in the computer in order to identify the fixed point time intervals and the modifiable time intervals in the magnetic resonance sequence. At least one gradient pulse, which occurs during at least one modifiable time interval of the number of modifiable time intervals, is optimized by taking the first moment of this at least one gradient pulse into account.

14 Claims, 4 Drawing Sheets

(56) References Cited

U.S. PATENT DOCUMENTS 8,030,920 B2    10/2011  Vu et al.
2014/0232396 A1    8/2014  Grodzki et al.
2015/0204959 A1*    7/2015  Grodzki ............... G01R 33/543
                                                                             324/314

* cited by examiner

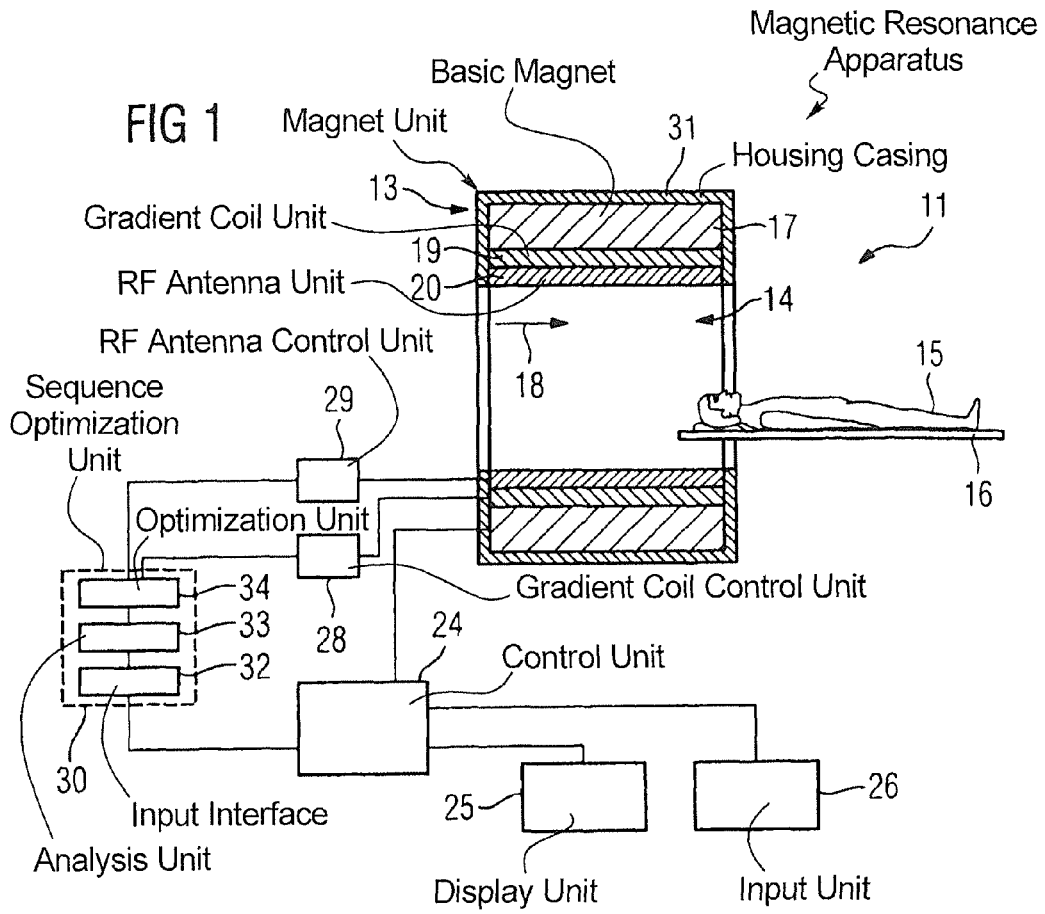
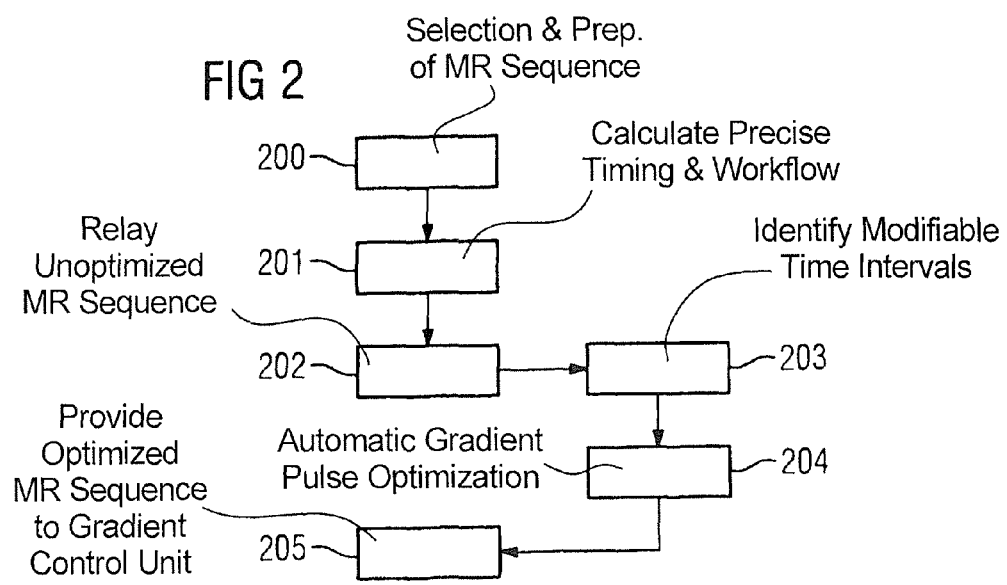

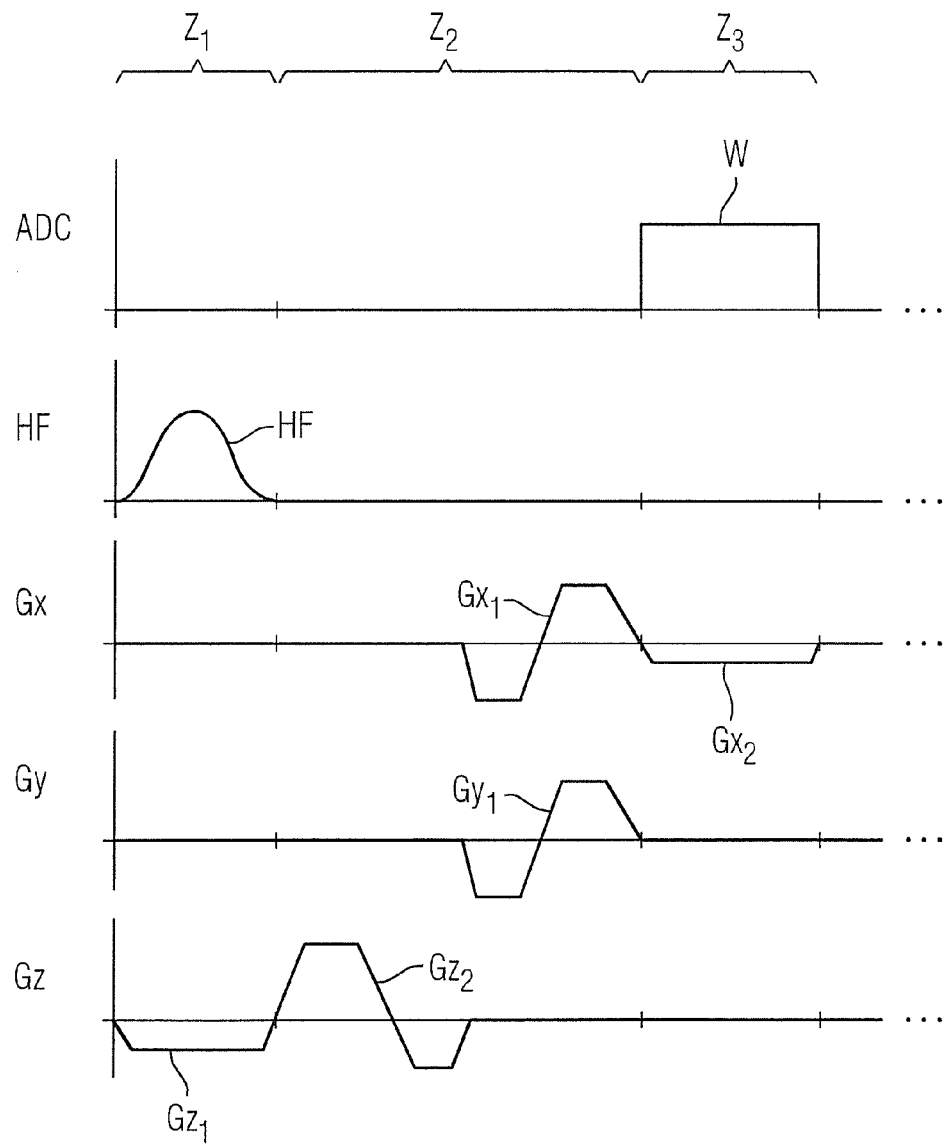

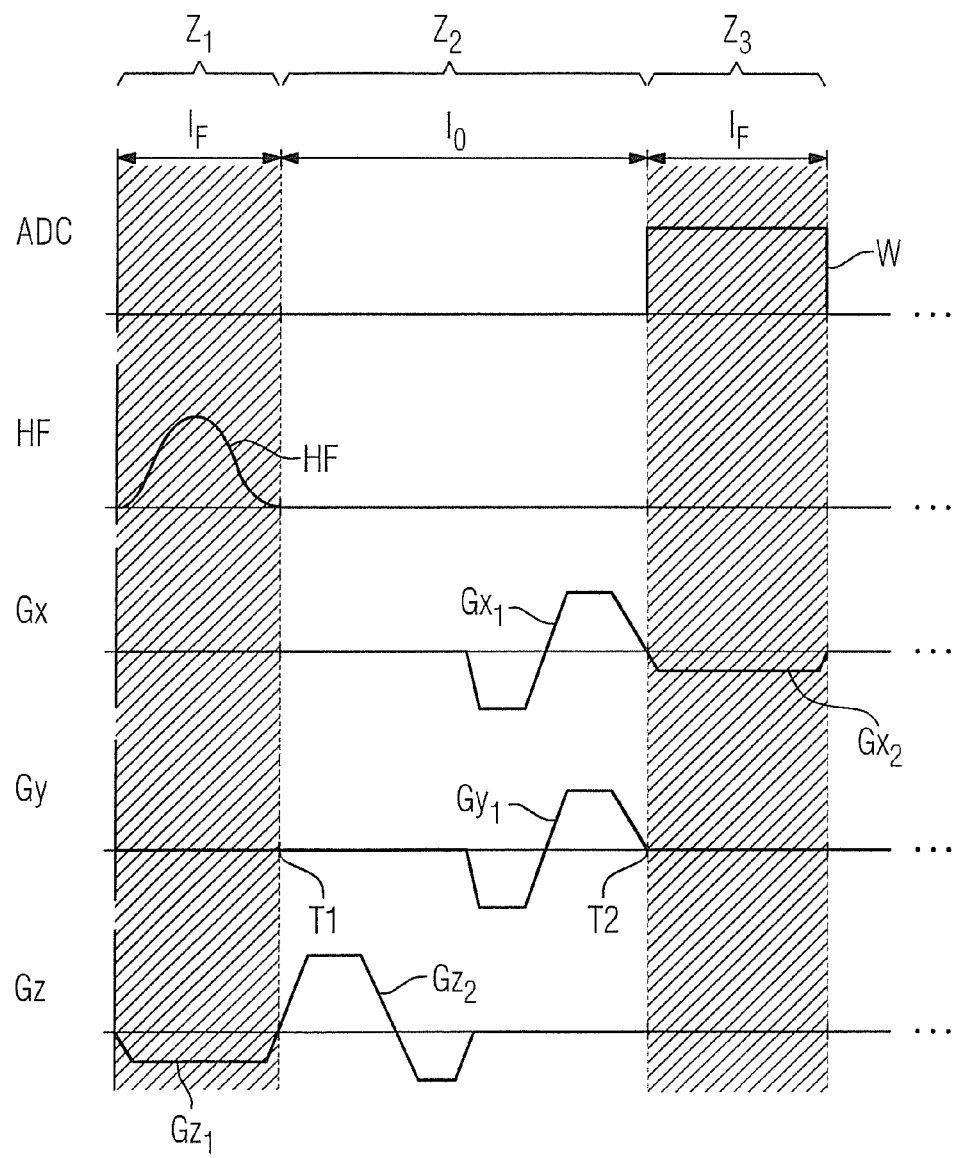

METHOD AND APPARATUS FOR OPTIMIZING A MAGNETIC RESONANCE SEQUENCE

BACKGROUND OF THE INVENTION

Field of the Invention

The invention relates to a method for optimizing a magnetic resonance sequence of a magnetic resonance apparatus, a method for operating a magnetic resonance apparatus, a sequence optimizing device, a magnetic resonance apparatus and a non-transitory, computer-readable data storage medium encoded with programming instructions to implement such methods.

Description of the Prior Art

In a magnetic resonance apparatus, also known as a "magnetic resonance tomography system", the body to be examined, particularly that of a patient, is typically exposed to a relatively strong magnetic field of, for example, 1.5 or 3 or 7 Tesla, with the use of a basic field magnet. In addition, gradient pulses are applied with the operation of a gradient coil unit. By the operation of a radio frequency antenna unit, using suitable antennas, radio frequency pulses, particularly excitation pulses, are transmitted, which cause nuclear spins of particular atoms, excited into resonance by these radio frequency pulses, to be tilted through a defined flip angle relative to the magnetic field lines of the basic magnetic field. During relaxation of the nuclear spin, radio frequency signals known as "magnetic resonance signals" are emitted and are received by suitable radio frequency antennas and then further processed. From the raw data thereby acquired, the desired image data can ultimately be reconstructed.

For a particular data acquisition, a particular magnetic resonance sequence, known as a pulse sequence composed of a sequence of radio frequency pulses, in particular excitation pulses and refocusing pulses, as well as gradient pulses to be transmitted suitably coordinated therewith on various gradient axes along different spatial directions, is to be transmitted. Temporally adapted thereto, readout windows are set which pre-determine the time frames within which the induced magnetic resonance signals are detected. Of decisive importance for the imaging is particularly the timing within the sequence, that is, at what temporal spacing which gradient pulses follow one another. A large number of the control parameters are typically defined in a "measuring protocol" which is created in advance and can be retrieved for a particular measurement, for example, from a memory store and, if necessary, can be modified by the user on site who can stipulate additional control parameters such as, for example, a particular slice increment of a batch of slices to be scanned, a slice thickness, etc. Then, based on all these control parameters, a magnetic resonance sequence is calculated.

SUMMARY OF THE INVENTION

An object of the invention is to provide improved optimization of a magnetic resonance sequence.

A method in accordance with the invention for optimizing a magnetic resonance sequence of a magnetic resonance apparatus includes the following steps. A magnetic resonance sequence, which includes a number of fixed point time intervals that are to be left unaltered and a number of modifiable time intervals that may be optimized, is entered into (provided to) a computer. In the computer, an automatic analysis of this magnetic resonance sequence is implemented in order to identify the fixed point time intervals and the modifiable time intervals in the magnetic resonance sequence. In the computer, an automatic optimization is implemented of at least one gradient pulse that occurs during at least one modifiable time interval of the number of modifiable time intervals and, during the automatic optimization of the at least one gradient pulse, a first moment of the at least one gradient pulse is taken into account.

A magnetic resonance sequence that is transmission-ready, but still optimizable, is used in the method according to the invention as the sequence that is initially provided to the computer. This magnetic resonance sequence typically has a number, that is, one or more, of radio frequency pulses, for example, at least one excitation pulse and/or refocusing pulse and a number of gradient pulses temporally coordinated therewith. The gradient pulses are typically defined by their gradient amplitude, the gradient pulse duration, and the edge steepness, that is, the first derivative of the gradient shape dG/dt of the gradient pulses, usually designated the slew rate. A further important variable of the gradient pulses is the zeroth gradient pulse moment, also known as the zeroth moment or the zeroth gradient moment, which is defined as the integral of the gradient amplitude of the gradient pulse over the duration of the gradient pulse.

Furthermore, the first gradient pulse moment, also known as the first moment, M1-moment or first gradient moment, can be calculated for a gradient pulse. The first moment of a gradient pulse is defined as the integral of the gradient amplitude of the gradient pulse multiplied by the time over the duration of the gradient pulse. The first moment of a gradient pulse is typically relevant for one phase of a magnetization. The first moment is relevant for several types of gradient pulse. In particular, flow compensation gradient pulses advantageously have a defined first moment.

Within the magnetic resonance sequence, typically the exact parameters of the radio frequency pulses, that is, the temporal length and shape, are precisely predetermined, as are the individual gradient pulses, by particular parameters such as temporal length, amplitude, edge steepness. The magnetic resonance sequence and its parameters are typically given by the imaging problem to be solved.

A magnetic resonance sequence is typically stored and then transmitted in the form of temporally arranged sequential time intervals, also known as "event blocks", to a control computer that then, for example, controls a radio frequency antenna unit for transmission of the individual radio frequency pulses, and to a gradient coil unit for transmission of the individual gradient pulses. In the method according to the invention, advantageously, the magnetic resonance sequence is now provided to a sequence optimizing unit in the form of time intervals. In principle, each time interval characterizes a particular event, for example, the transmission of a fat saturation pulse, a particular repetition within a gradient echo sequence, a transmission of a flow compensation gradient pulse, etc. The individual events can include, under certain circumstances, of a number of radio frequency pulses or switched readout windows and, adapted thereto, switched gradient pulses. Switching of a readout window is typically understood in this context to mean the activation of a receiving device for the magnetic resonance signals, for example, an ADC (analogue-digital converter), which is coupled to receiving coils of the magnetic resonance device.

Also implemented by the sequence optimizing unit, in particular an analysis unit thereof, is automatic analysis of the magnetic resonance sequence in order to identify the fixed point time intervals in the magnetic resonance sequence which are to be left unaltered and to identify modifiable time intervals in the magnetic resonance sequence which may be optimized. Fixed point time intervals are herein to be understood, in particular, as individual time points or time intervals at which the current values of the gradient pulses remain unmodifiable, so that the gradient pulses can continue to fulfill their intended function. These include, for example, slice selection gradients or gradient pulses during the readout times which serve to reach a particular coding at a particular time point. Further examples are given below.

Apart from these unmodifiable individual points or time intervals at which a particular gradient pulse must have a quite particular value, there are modifiable time intervals lying therebetween in which gradient pulses are entirely or partially arranged that, also fulfill a particular function, but for which it is not so important that the time data are exactly adhered to and, for example, for a particular amplitude of the gradient pulse to exist at a very exact time point. Often what is important is only that a predetermined amplitude of the gradient pulse is reached by a particular time point, that from a particular time point a predetermined amplitude of the gradient pulse is ramped down or that within a broader time interval, at least a particular zeroth moment or first moment of the gradient pulse is reached. In these time intervals, the shape, or the form, of the gradient pulses, the pulse shape or the gradient shape can be altered, in principle, while keeping to particular limit conditions, so that these modifiable time intervals are available for an optimization.

In the inventive method, at least one limit condition concerns the first moment of the at least one gradient pulse. A possible limit condition for automatic optimization of the at least one gradient pulse can therefore be that, over a defined time period, a particular first moment is reached. Therefore, in this way, particularly during the automatic optimization of the at least one gradient pulse, the first moment of the at least one gradient pulse is taken into account. For example, during the automatic optimization of the at least one gradient pulse, the first moment of the at least one gradient pulse is kept constant.

Then, in a further step, the automatic optimization of at least one gradient pulse takes place in a modifiable time interval. The automatic optimization takes place, particularly, according to a predetermined optimization criterion. In principle, any desired optimization criterion can be pre-set.

For example, in one variant within the scope of the invention, an optimization can take place such that the coding by means of the gradient pulses takes place as fast as possible in order, for example, to minimize flow artifacts from moving substances, for example, blood flow.

In a preferred variant, for example, optimization of the at least one gradient pulse is implemented for noise reduction. During a magnetic resonance sequence, the magnetic gradient coils, by means of which the gradient pulses are emitted, are frequently and rapidly switched over. Since the time pre-selections within a magnetic resonance sequence are mostly very strict and also the overall duration of a magnetic resonance sequence which determines the overall duration of a magnetic resonance examination must be kept as small as possible, gradient amplitudes of about 40 mT/m and slew rates of up to 200 mT/m/ms must sometimes be achieved. In particular, such a high edge steepness contributes to the known noise manifestations during the switching of the gradient pulses. Eddy currents in other components of the magnetic resonance device, in particular the high-frequency screening are a reason for this noise nuisance. In addition, steep edges of the gradient pulses lead to a higher energy usage and also place greater demands on the gradient coils and the other hardware. The rapidly changing gradient fields lead to distortions and oscillations in the gradient coils and to transmission of these energies to the housing of the magnetic resonance device. If the basic field magnet has superconducting coils, a high degree of helium boil-off can occur due to heating of the coils and the other components.

For noise optimization, the first derivative of the gradient shape in the modifiable time intervals, can be optimized automatically. This means that the gradient shape is optimized, for example, in the at least one modifiable time interval such that under particular limit conditions, the lowest possible slew rate of the gradient pulse is maintained since this leads to particularly high noise levels. Particularly preferably, the gradient shape is smoothed during the optimization since, in this way, a particularly good noise reduction is achieved. In other words, the optimization step takes place with respect to the greatest possible noise reduction in that the gradient shape of the at least one gradient pulse is optimized with respect to minimizing the first derivative of the function which defines the gradient shape. Furthermore, in this way, a smaller loading of the gradient system is achieved. Accompanying this are a smaller power consumption, reduced heating of the gradient coils and thus also a lessened helium boil-off. In addition, however, amplitudes of the at least one gradient pulse are minimized.

Since the optimization for noise reduction, that is, optimization of the first derivative of the gradient shape, is probably the most frequent case of use, this variant is mostly used by way of example below. However, the method should not be restricted by these examples to this optimization criterion, provided this is not explicitly mentioned.

Particularly preferably, the optimization takes place, independently of the optimization criteria used, with the temporal length of the respective time intervals kept constant, so that the timing of the magnetic resonance sequence remains unaffected overall by the optimization. It is also possible, in principle, to specify different optimization criteria, for example, also different optimization criteria for different temporal sections or different types of gradient pulses.

With the method according to the invention, the entire gradient shape is advantageously automatically optimized without observing the individual gradient pulses. Only at the important time points and/or in the fixed point time intervals of the magnetic resonance sequence which are unmodifiable as described in relation to the current gradient amplitudes is the gradient shape left at the defined value. Therebetween, all the regions—also across the gradient pulses—are accessible to an optimization of the gradient shape.

Since the first moment of the at least one gradient pulse is taken into account in the inventive procedure, gradient pulses that are sensitive to a particular first moment and, for example, require a particular first moment, can also be optimized. Taking account of only the zeroth moment in the optimization of the gradient pulses in this type of gradient pulses that are sensitive to a particular first moment, would not suffice for optimization. Thus, taking account of the first moment of the at least one gradient pulse causes a gradient pulse that is sensitive to a first moment to define a modifiable time interval, and thus it can be optimized. A gradient pulse of this type can be, for example, a flow compensation gradient pulse. Thus, for example, a further reduction of the loudness of the magnetic resonance sequence can be achieved within the optimization method.

In an embodiment, the at least one gradient pulse is configured as a flow compensation gradient pulse. A flow compensation gradient pulse is used, inter alia, in an angiographic magnetic resonance sequence and/or a susceptibility-weighted magnetic resonance sequence. It advantageously serves to suppress movement artifacts of moving nuclear spins. A flow compensation gradient pulse typically has at least one positive part that has a positive gradient amplitude and at least one negative part that has a negative gradient amplitude. Typically, a flow compensation gradient pulse has a defined first moment. If, during optimization of a flow compensation gradient pulse, the first moment of the flow compensation gradient pulse is not taken into account, then the at least one positive part and the at least one negative part of the flow compensation gradient pulse could at least partially average out during the optimization of the at least one flow compensation gradient pulse. Thus, by optimizing the flow compensation gradient pulse without taking account of the first moment of the flow compensation gradient pulse, the functioning of the flow compensation gradient pulse could be restricted. A flow compensation gradient pulse can be particularly advantageously optimized by the inventive procedure taking account of the first moment of the flow compensation gradient pulse. Thus, for example, the loudness of the flow compensation gradient pulse can be significantly reduced. This is particularly advantageous since non-optimized flow compensation gradient pulses typically use particularly high slew rates and are therefore particularly loud.

In another embodiment, during the automatic optimization of the at least one gradient pulse, the first moment of the at least one gradient pulse is kept constant. For this purpose, the optimizing of the at least one gradient pulse is advantageously carried out under the limit condition of keeping the first moment of the at least one gradient pulse constant. The constant first moment of the at least one gradient pulse can be used as a further limit condition alongside limit conditions such as a constant zeroth moment of the at least one gradient pulse. When the at least one gradient pulse is kept constant, it is advantageously ensured that the first moment of the at least one gradient pulse before and after the optimization of the at least one gradient pulse is the same. A tolerance range for the first moment of the at least one gradient pulse can naturally be pre-set. How the first moment of the at least one gradient pulse is generated after the optimization can herein be irrelevant. This procedure is particularly advantageous with regard to the optimization of a flow compensation gradient pulse since said pulses typically require a defined first moment.

In a further embodiment, the magnetic resonance sequence has measurement parameters that include a pre-defined first moment for the at least one gradient pulse wherein, during the automatic optimization of the at least one gradient pulse, the first moment of the at least one gradient pulse is set to the pre-set first moment. The first moment can be pre-set, in particular through the magnetic resonance sequence and/or by settings of a user for the at least one gradient pulse. A particular value for the first moment of the at least one gradient pulse which should exist, possibly within a tolerance range, following the optimization of the at least one gradient pulse can be pre-set. By pre-setting an advantageous first moment for the at least one gradient pulse, the at least one gradient pulse can even have an improved first moment following the optimization. This is the case particularly if the at least one gradient pulse does not have an optimum first moment before the optimization. By this means, the functioning of the at least one gradient pulse, for example, a flow compensation, can be improved.

In another embodiment, during the automatic optimization of the at least one gradient pulse, a spline interpolation method is used. In principle, for optimization, different methods can be used to keep the first derivative of the gradient shape as small as possible and thereby to maintain the pre-set limit conditions, in particular to reach the given fixed points. It has been found to be particularly effective to use a "spline interpolation" method. In a spline interpolation, an attempt is made to interpolate at key points, thus in the present case, the fixed points, for example, with the use of piecewise continuous polynomials, known as splines. The spline interpolation method has the advantage that with only a small computational effort, usable curve shapes are achieved with particular approximation properties even where the fixed points are unfavorably positioned. In particular, a spline interpolation can even be calculated with a low degree of linear effort. A spline interpolation method is suitable in particular for a particularly advantageous manner for performing an optimization of the at least one gradient pulse while taking account of a particular first moment. Various spline interpolation methods can be used herein for various types of gradient pulses. For the optimization of gradient pulses which are not sensitive for a particular first moment, for example, a spline of lower order than for the optimization of gradient pulses which are sensitive for a particular first moment can be used.

In another embodiment, during the automatic optimization of the at least one gradient pulse, a fifth order spline interpolation method is used. A fifth order spline interpolation method is particularly advantageous if the following six limit conditions are to be observed during the optimization of the gradient shape of the at least one gradient pulse in an interval with a first interval boundary and a second interval boundary:

keeping the gradient amplitude of the at least one gradient pulse constant at the first interval boundary, keeping the gradient amplitude of the at least one gradient pulse constant at the second interval boundary, setting the derivative of the at least first gradient pulse to zero at the first interval boundary, setting the derivative of the at least one gradient pulse to zero at the second interval boundary, keeping the zeroth moment of the at least one gradient pulse constant, and keeping the first moment of the at least one gradient pulse constant.

The limit conditions can provide necessary parameters for the fifth order spline which are intended to describe the gradient shape of the at least one optimized gradient pulse.

In another embodiment, a time range of the magnetic resonance sequence is identified as a fixed point time interval at least when, according to the magnetic resonance sequence, in the time range, at least one of the following events should take place:

emission of a radio frequency pulse. If a radio frequency pulse is emitted at the same time, it can be assumed that the gradient pulse switched at this time serves to cause the radio frequency pulse to act on a particular spatial volume. Therefore, a change in the amplitude of the gradient pulse during this time interval would lead to a falsification of the magnetic resonance sequence.

reading out of raw data, that is, the setting of a readout window, in particular the switching of an ADC to reception readiness. Here also, the simultaneously switched gradient pulses serve to encode the spatial region in which the magnetic resonance signals are received. A change in the gradient amplitude during this time interval would also lead to a falsification of the magnetic resonance sequence.

switching of a diffusion gradient pulse. These diffusion gradient pulses serve to apply a defined gradient amplitude over quite specific time intervals in order thus to achieve a particular encoding of the signal. Therefore a change would lead to a falsification of the measurement.

switching of a knocking gradient pulse. Such knocking gradient pulses (or "tok-tok-tok pulses") serve, at the beginning of a measurement, to generate a defined, not too loud but not so quiet, knocking sound. Then, the patient situated in the magnetic resonance device can ready himself or herself for the measurement starting, with a typically unavoidable noise nuisance. If such knocking gradient pulses were subjected, for example, to a noise optimization, then this would lead to a noise minimization from the knocking gradient pulses, which would then no longer fulfill their function of pre-warning the patient.

In another embodiment, the identification of a time range as a fixed point time interval or as a modifiable time interval takes place by means of at least one of the following methods:

analysis of the radio frequency pulse transmission times, analysis of the readout times, analysis of a gradient shape, for example, in that it is compared with pre-set sample gradient shapes for particular unmodifiable gradient pulses. If a gradient pulse corresponds to this sample gradient pattern, this is an indication that what is concerned is such an unmodifiable gradient pulse;

analysis of identifiers contained in a parameter set, for example, of names, flags etc., which indicate that the subsequent gradient shape in the time interval in question is a gradient pulse which is not to be modified. For example, a time interval which contains a particular gradient pulse can be contained within a fixed scanning grid of pre-set time points. Alternatively, however, the parameters can be included by means of a rise time, the maximum amplitude to be reached after a specific time, the duration of a plateau time during which the amplitude is kept constant, and a fall time, in order to define the gradient pulse completely. In addition, in both cases, the time interval and/or the parameter set can also contain a stipulation of whether the time interval contains an unmodifiable gradient pulse or even a coding and/or an identification regarding what type of gradient pulse it is, for example, a diffusion gradient pulse, etc. The parameter set can also be associated with at least one gradient pulse.

It is also possible for not only the above-mentioned types of gradient pulses to be defined as unmodifiable, but also, according to need, further gradient pulses or types of gradient pulses are stipulated as unmodifiable for the particular magnetic resonance sequence in that, for example, the analyzing unit is set accordingly in order to identify such defined unmodifiable further gradient pulses and/or in that corresponding identifiers for these gradient pulses are set in the parameter sets. The above-mentioned preferred variants show that it is possible in a relatively simple manner to identify the fixed point time intervals and to optimize the remaining time intervals.

In another embodiment, during the automatic optimization of the at least one gradient pulse, a zeroth moment of the at least one gradient pulse is kept constant. Particularly in addition to taking account of the first moment of the at least one gradient pulse, this is an advantageous limit condition in the optimization of the at least one gradient pulse.

In another embodiment, during the optimization of the at least one gradient pulse, a gradient amplitude of the at least one gradient pulse is kept constant at fixed points, wherein the fixed points preferably comprise at least limit values at interval boundaries of the at least one modifiable time interval to neighboring fixed point time intervals. Herein, particular fixed points can be pre-set within the optimizable time interval, for example, the achievement of an amplitude value of zero at a very particular time point. Preferably, however, the fixed points are at least the limit values at interval boundaries of the modifiable time interval at neighboring fixed point time intervals. Where re-sorting of the event blocks takes place, into outgoing event blocks which each contain only either a modifiable time interval or a fixed point time interval, then the limit values are, for example, the boundary values at the start and end of the respective optimizable outgoing event block. By means of this limit condition, it is ensured that there are no jumps in the gradient shape and the form of the gradient pulse is selected such that it extends continuously across event block limits and/or across borders between fixed point time intervals and modifiable time intervals.

In another embodiment, during the optimization of the at least one gradient pulse, a rise of a gradient amplitude of the at least one gradient pulse is set to zero at fixed points, wherein the fixed points preferably comprise at least limit values at interval boundaries of the at least one modifiable time interval to neighboring fixed point time intervals. In this way, an even transition of the gradient shape can be achieved across time intervals without edges and/or kinks.

A number of adjoining gradient pulses of a gradient axis can be grouped together to a joint gradient pulse. This offers a particular advantage, since the gradient amplitude is not unnecessarily reduced to a value of zero only subsequently to rise again with a correspondingly steep edge to form the next gradient pulse.

At the conclusion of the optimization, a gradient shape of the at least one optimized gradient pulse is tested for adherence to the system specification parameters, preferably at least the observance of a maximum permissible gradient amplitude and/or a maximum permissible slew rate. If the gradient shape of the at least one optimized gradient pulse does not keep to the system specification parameters, the gradient shape of the at least one optimized gradient pulse is advantageously replaced again by the original gradient shape of the at least one gradient pulse.

Furthermore, the magnetic resonance sequence can be transferred in the form of chronologically sequential event blocks to a gradient coil unit. Before the transfer to the gradient coil unit, arriving event blocks of the magnetic resonance sequence can be analyzed to identify the fixed point time intervals and the modifiable time intervals in each event block. Depending thereon, a new subdivision of the magnetic resonance sequence into outgoing event blocks can take place. In this process, each event block typically characterizes a particular event, for example, the transmission of a fat saturation pulse, a particular flow compensation gradient, a particular repetition within a gradient echo sequence, etc. The individual events can include, under certain circumstances, a number of radio frequency pulses and/or switched readout windows and, adapted thereto, switched gradient pulses. The new subdivision preferably takes place such that either an event block contains only one fixed point time interval or one modifiable time interval. In other words, the fixed point time intervals and the modifiable time intervals are advantageously passed on as separate outgoing event blocks, for example, from the analysis unit to the gradient coil unit wherein, particularly preferably, adjoining fixed point time intervals and adjoining modifiable time intervals in adjoining ingoing event blocks are grouped together into new outgoing event blocks. According to the invention, the outgoing event blocks that contain a modifiable time interval are then initially subjected to the optimization step for optimizing the gradient shape of at least one gradient pulse before then being transferred to the gradient coil unit. By contrast, the outgoing event blocks, which consist of only one fixed point time interval, are passed on unchanged to the gradient coil unit, possibly (if needed) after a delay so that they arrive at the gradient coil unit suitably chronologically coordinated with the now optimized outgoing event blocks. The gradient coil unit then sequentially outputs the non-optimized event blocks and the optimized event blocks in the relevant order, that is, it sends the relevant control commands to the radio frequency antenna unit and the gradient coil unit, so that the entire optimized magnetic resonance sequence is emitted in the correct temporal manner, preferably with timing unchanged as before the optimization.

The invention also relates to a method for operating a magnetic resonance apparatus wherein, initially in a method according to the invention for optimizing a magnetic resonance sequence, a magnetic resonance sequence is optimized and then the magnetic resonance device is operated using the optimized magnetic resonance sequence. During the measurement, that is when a patient is lying in a patient tunnel of the magnetic resonance device, reduced noise is then generated, for example, with a suitably selected optimization criterion, without losses in the image quality and without the measurement duration being prolonged. The optimization can preferably be carried out online during the playing out, or directly before the playing out, of the magnetic resonance sequence.

The invention further encompasses a sequence optimizing unit for optimizing a magnetic resonance sequence of a magnetic resonance device. The sequence optimizing unit has a computer configured to execute the method according to the invention for optimizing a magnetic resonance sequence of a magnetic resonance device.

For this purpose, the sequence optimizing unit has an input interface configured to accept a magnetic resonance sequence as an input, wherein this magnetic resonance sequence includes a number of fixed point time intervals that are to be left unmodified, and a number of modifiable time intervals that may be optimized.

Furthermore, the sequence optimizing unit has an analysis unit configured to automatically analyze the magnetic resonance sequence so as to identify the fixed point time intervals and the modifiable time intervals in the magnetic resonance sequence.

The sequence optimizing unit also has an optimizing unit configured to automatically optimize at least one gradient pulse that occurs during at least one modifiable time interval of the number of modifiable time intervals. During this automatic optimization of the at least one gradient pulse, a first moment of the at least one gradient pulse is taken into account.

Embodiments of the sequence optimizing unit according to the invention are configured similarly to the embodiments of the method according to the invention. The sequence optimizing unit can have further control components that are necessary and/or advantageous for carrying out a method according to the invention. The sequence optimizing unit can also be configured to transmit control signals to a magnetic resonance device and/or to receive and/or process control signals in order to carry out a method according to the invention. Preferably, the sequence optimizing unit is part of the control computer of the magnetic resonance device and is preferably connected relatively closely upstream of the radio frequency antenna unit and/or the gradient coil unit. In a memory unit of the sequence optimizing unit, computer programs and other software can be stored, by means of which a processor of the sequence optimizing unit automatically controls and/or carries out a method sequence of a method according to the invention.

The magnetic resonance apparatus according to the invention has a sequence optimizing unit as described above. The magnetic resonance apparatus according to the invention is thus configured to execute the method according to the invention with the sequence optimizing unit. The sequence optimizing unit can be integrated into the magnetic resonance apparatus. The sequence optimizing unit can also be installed separately from the magnetic resonance apparatus. The sequence optimizing unit can be connected to the magnetic resonance apparatus.

The storage medium according to the invention is directly loadable into a memory of a programmable computer unit of a magnetic resonance apparatus and has program code that cause the method according to the invention to be executed by when the computer of the magnetic resonance apparatus. The method according to the invention thus can be carried out rapidly, exactly reproducibly and robustly. The computer must have pre-conditions such as, for example, a suitable working memory store, a suitable graphics card or a suitable logic unit so that the respective method steps can be carried out efficiently. Examples of electronically readable data storage media are a DVD, a magnetic tape or a USB stick, on which electronically readable control information, in particular software (see above) is stored.

The advantages of the method according to the invention for operating a magnetic resonance apparatus, the sequence optimizing unit according to the invention, the magnetic resonance apparatus according to the invention and the storage medium according to the invention substantially correspond to the advantages of the method according to the invention, as described in detail above. In this regard, the corresponding functional features of the method are configured with suitable modules such as hardware modules.

BRIEF DESCRIPTION OF THE DRAWINGS

FIG. 1 schematically illustrates a magnetic resonance device according to the invention, for implementing the method according to the invention.

FIG. 2 is a flowchart of an embodiment of the method according to the invention.

FIG. 3 is a sequence diagram of a magnetic resonance sequence which is to be optimized according to the method according to the invention.

FIG. 4 is the sequence diagram according to FIG. 3, wherein the magnetic resonance sequence is subdivided into fixed point time intervals and modifiable time intervals.

DESCRIPTION OF THE PREFERRED EMBODIMENTS

Figure 5:
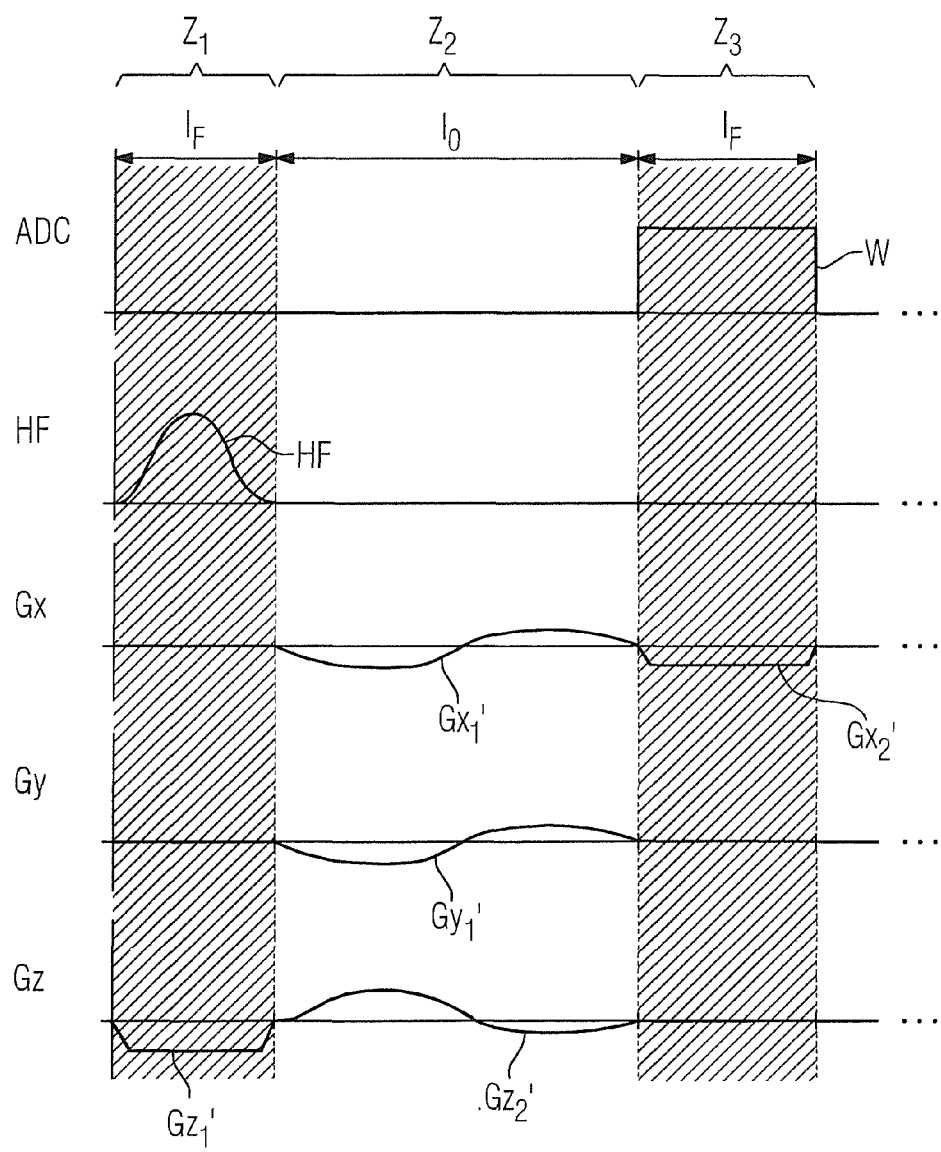
FIG. 5 is the sequence diagram according to FIGS. 3 and 4 after optimization of gradient pulses that occur during the modifiable time intervals.

FIG. 1 shows a magnetic resonance apparatus 11 according to the invention for implementing the method according to the invention in a schematic representation. The magnetic resonance apparatus 11 has a data acquisition unit that has a magnet unit 13 (also commonly known as a scanner) with a basic field magnet 17 for generating a strong and constant basic magnetic field 18. Furthermore, the magnetic resonance apparatus 11 has a cylindrical patient receiving region 14 for accommodating a patient 15. The patient receiving region 14 is cylindrically enclosed circumferentially by the magnet unit 13. The patient 15 can be moved by a patient support 16 of the magnetic resonance apparatus 11 into the patient receiving region 14. For this purpose, the patient support 16 has a patient table that is movable within the magnetic resonance apparatus 11. The magnet unit 13 is screened toward the outside by a housing covering 31 of the magnetic resonance apparatus 11.

The magnet unit 13 also has a gradient coil unit 19 for generating magnetic field gradients that are used for spatial encoding during imaging. The gradient coil unit 19 is controlled by a gradient control unit 28. The magnetic field gradients are generated along gradient axes in the x-, y- and z-directions. For this purpose, the gradient coils of the gradient coil unit 19 are controllable independently of one another in the x-, y- and z-directions, so that by means of a pre-set combination, gradients can be created in any desired spatial directions (for example, in the slice selection direction, in the phase-encoding direction or in the readout direction), wherein these directions typically depend on the selected slice orientation. Equally, the spatial directions of the gradient switching can match the x-, y- and z-directions, thus for example, the slice selection direction can point in the z-direction, the phase encoding in the y-direction and the readout direction in the x-direction. The x-direction in this context means the direction which extends horizontally perpendicularly to the direction of the basic magnetic field 18, the z-direction. The y-direction is the direction that extends perpendicularly to the z-direction and perpendicularly to the x-direction.

Furthermore, the magnet unit 13 has a radio frequency antenna unit 20 which, in the case shown, is configured as the body coil firmly integrated into the magnetic resonance device 10 and a radio frequency antenna control unit 29 for excitation of a polarization which is created in the main magnetic field 18 generated by the main magnet 17. The radio frequency antenna unit 20 is controlled by the radio frequency antenna control unit 29 and radiates radio frequency pulses into an examination space which is substantially formed by the patient receiving region 14.

For control of the main magnet 17, the gradient control unit 28 and the radio frequency antenna control unit 29, the magnetic resonance device 11 has a control computer 24. The control computer 24 controls the magnetic resonance apparatus 11, for example, the execution of the magnetic resonance sequences, centrally. Control information such as, for example, imaging parameters and reconstructed magnetic resonance images can be displayed for a user on a display unit 25, for example on at least one monitor of the magnetic resonance apparatus 11. In addition, the magnetic resonance apparatus 11 has an input unit 26 by means of which information and/or imaging parameters can be input by a user during a measuring procedure. The control computer 24 can include the gradient control unit 28 and/or the radio frequency antenna control unit 29 and/or the display unit 25 and/or the input unit 26.

The magnetic resonance apparatus 11 also has a sequence optimizing unit 30 that includes a computer for optimizing imaging parameters of magnetic resonance sequences. For this purpose, the sequence optimizing unit 30 also has an input interface 32, an analysis unit 33 and an optimizing unit 34. The magnetic resonance device 11, in particular the sequence optimizing unit 30, is configured for implementing the method according to the invention.

The magnetic resonance apparatus 11 can naturally have further components that magnetic resonance apparatuses typically have. That general functioning of a magnetic resonance apparatus is known to those skilled in the art, so that a detailed description of the further components is not necessary herein.

FIG. 2 is a flowchart of an embodiment of a method according to the invention. In a first method step 200, initially a selection and preparation of a magnetic resonance sequence is implemented in the usual manner. This means that typically a user stipulates via the input unit 26 the type of magnetic resonance sequence and/or seeks a suitable protocol in which a particular magnetic resonance sequence is defined. The protocols contain various imaging parameters for the respective magnetic resonance sequence. These imaging parameters include particular basic data for the desired magnetic resonance sequence, for example, the type of magnetic resonance sequence, that is, whether it is a spin echo sequence, a turbo spin echo sequence, etc. Furthermore, the imaging parameters include slice thicknesses, slice spacings, number of the slices, resolution, repetition times, the echo times in a spin echo sequence, etc. With the aid of the input unit 26, the user can modify part of these imaging parameters in order to generate an individual magnetic resonance sequence for a currently desired measurement. For this purpose, modifiable imaging parameters are offered to the user, for example, on a graphical user interface of the display unit 25 for modification. In particular, it can be made possible for a user to pre-set a first moment for at least one gradient switching of the magnetic resonance sequence by means of the input unit 26. The magnetic resonance sequence then includes measurement parameters which include a pre-set first moment for the at least one gradient pulse.

In a further method step 201, the precise timing and sequence of the magnetic resonance sequence are then calculated with the pre-set defined imaging parameters. The magnetic resonance sequence can be calculated in the control unit 24 which, for example, is realized in the form of software components in a computer system of the magnetic resonance apparatus 11. The magnetic resonance sequence has a number of fixed point time intervals that are to be left unmodified, and a number of modifiable time intervals that may be optimized.

In a further method step 202, the passing on of the magnetic resonance sequence which is transmission-ready but not yet optimized takes place in the form of time intervals, also known as event blocks. No direct passing on of the time intervals to the gradient control unit 28 and the radio frequency antenna control unit 29 takes place. Rather, in the further method step 202 of the control unit 24, before being passed on to the gradient control unit 28 and the radio frequency antenna control unit 29, the magnetic resonance sequence is initially handed on to the sequence optimizing unit 30 for optimizing of the magnetic resonance sequence. For this purpose, the input interface 32 of the sequence optimizing unit 30 is configured to accept the magnetic resonance sequence which is actually transmission-ready, but is to be optimized.

In a further method step 203, the analysis unit 33 of the sequence optimizing unit 30 automatically analyzes the magnetic resonance sequence and identifies fixed point time intervals and modifiable time intervals in the magnetic resonance sequence. This is shown as an example in the transition from FIG. 3 to FIG. 4.

In particular, during the automatic analysis of the magnetic resonance sequence, a time interval of a gradient axis within the magnetic resonance sequence is identified as a fixed point time interval of the analysis unit 33 at least when, according to the magnetic resonance sequence, at least one of the following events should take place in the time interval:

emission of a radio frequency pulse,
readout of raw data,
switching of a diffusion gradient pulse,
switching of a knocking gradient pulse.

Naturally, it is also conceivable that a further or differently configured event identifies a time interval as a fixed point time interval, provided it appears useful to those skilled in the art.

For this purpose, in order to identify a time interval of a gradient axis within the magnetic resonance sequence as a fixed point time interval or as a modifiable time interval, the analysis unit 33 utilizes at least one of the following methods:

Analysis of the radio frequency pulse transmission times,
Analysis of the readout times,
Analysis of a gradient shape,
Analysis of identifiers contained in a parameter set.

The analysis unit 33 can also utilize a further method which appears useful to those skilled in the art for identifying the time interval.

In a further method step 204, automatic optimization of at least one gradient pulse by means of the optimizing unit 34 of the sequence optimizing unit 30 is carried out. The at least one gradient pulse occurs during at least one modifiable time interval of the number of modifiable time intervals. During the automatic optimization of the at least one gradient pulse, a first moment of the at least one gradient pulse is taken into account. The at least one gradient pulse is configured, for example, as a flow compensation gradient pulse. The further method step 204 is shown as an example in the transition from FIG. 4 to FIG. 5.

In particular, the optimizing of the at least one gradient pulse takes place for noise optimization. For this purpose, particularly preferably, in the modifiable time intervals, the first derivative of the gradient shape of the at least one gradient pulse can be optimized automatically. Also, when the at least one gradient pulse is optimized, the zeroth moment of the at least one gradient pulse and the first moment of the at least one gradient pulse is advantageously kept constant. If a pre-set first moment is determined for the at least one gradient pulse, for example, via the input unit 26, then during the automatic optimization of the at least one gradient pulse, the first moment of the at least one gradient pulse is advantageously set to the pre-set first moment.

During the optimization of the at least one gradient pulse, a gradient amplitude of the at least one gradient pulse is advantageously kept constant at fixed points, wherein the fixed points preferably are at least limit values at interval boundaries of the at least one modifiable time interval at neighboring fixed point time intervals. Further, during the optimization of the at least one gradient pulse, a rise of a gradient amplitude of the at least one gradient pulse is advantageously set to zero at fixed points, wherein the fixed points preferably comprise at least limit values at interval boundaries of the at least one modifiable time interval to neighboring fixed point time intervals.

In order to observe these limit conditions, during the automatic optimization of the at least one gradient pulse, a spline interpolation method, in particular a fifth order spline interpolation method is used by the optimizing unit 34.

In a further method step 205, the optimized magnetic resonance sequence is finally transferred by the sequence optimizing unit 30 to the gradient control unit 28 and the radio frequency antenna control unit 29. The gradient control unit 28 and the radio frequency antenna control unit 29 generate the relevant control commands from the optimized magnetic resonance sequence and pass these to the radio frequency antenna unit 20 and the gradient coil unit 19, so that the overall optimized magnetic resonance sequence is played out in the correct temporal sequence with, for example, a reduced loudness compared with before the optimization, in order to acquire magnetic resonance image data by operation of the magnetic resonance apparatus 11.

The method steps of the method according to the invention shown in FIG. 2 are implemented by the magnetic resonance apparatus 11, in particular by the sequence optimizing unit 30. For this purpose, the magnetic resonance device, in particular the sequence optimizing unit 30, includes the required software and/or computer programs which are stored in a memory store of the magnetic resonance device 11, in particular the sequence optimizing unit 30. The software and/or computer programs include program code configured to cause the method according to the invention to be executed by the magnetic resonance apparatus 11, particularly in the sequence optimizing unit 30, by a processor of the magnetic resonance device 11, in particular the sequence optimizing unit 30.

FIG. 3 shows, as an example, a sequence diagram of a part of a highly simplified magnetic resonance sequence which is subdivided by way of example, into three time intervals $Z_1$, $Z_2$, $Z_3$. In this sequence diagram, in the usual manner, the readout window W, the radio frequency pulses RF which are to be transmitted and the gradient pulses are represented on separate time axes as a function of time t, one above the other. On the topmost readout time axis, ADC, the readout window W is shown. On the second to top radio frequency pulse-time axis RF, the amplitudes of the radio frequency pulses RF to be transmitted are shown. On the x-gradient axis Gx lying thereunder, the gradient pulses $Gx_1$, $Gx_2$ are shown in the readout direction. Shown on the y-gradient axis Gy is the gradient pulse $Gy_1$ which is switched in the phase encoding direction. On the bottom z-gradient axis Gz, the gradient pulses $Gz_1$, $Gz_2$ are shown in the slice selection direction. The position of each gradient axis Gx, Gy, Gz denotes the respective zero line, which means that the gradient pulses can have negative or positive amplitudes, depending on whether their amplitudes extend downwardly or upwardly from the gradient axis Gx, Gy, Gz.

In all the sequence diagrams, for simplification, the scaling in the time direction and the amplitude direction is only in arbitrary units. Naturally, the gradient pulses as set, the radio frequency pulse RF as set and the readout window W as set are only one possible arrangement. If it appears useful to those skilled in the art, he or she can modify the number and/or shape and/or temporal length of the gradient pulses and/or the radio frequency pulses RF and/or the readout window W relative to the present exemplary embodiment.

During the first time interval $Z_1$ of the magnetic resonance sequence, a radio frequency pulse RF is emitted to excite the nuclear spin. At the same time, during the first time interval $Z_1$, a gradient pulse $Gz_1$ is played out on the z-gradient axis Gz, the slice selection direction, so that the radio frequency pulse HF acts slice-selectively.

Immediately following the ending of this radio frequency pulse RF, flow compensation gradient pulses $Gx_1$, $Gy_1$, $Gz_2$ occur on all three gradient axes Gx, Gy, Gz. Therefore, an x-flow compensation gradient pulse $Gx_1$ occurs on the x-gradient axis Gx in the readout direction. A y-flow compensation gradient pulse $Gy_1$ occurs on the y-gradient axis Gy in the phase encoding direction. A z-flow compensation gradient pulse $Gz_2$ occurs on the z-gradient axis Gz in the slice selection direction. It can be seen that each flow compensation gradient pulse $Gx_1$, $Gy_1$, $Gz_2$ has a negative partial region with a negative gradient amplitude and a positive partial region with a positive gradient amplitude. In place of the flow compensation gradient pulses $Gx_1$, $Gy_1$, $Gz_2$, other gradient pulses that appear useful to those skilled in the art and which are sensitive to a first moment can also be played out.

During the third time interval $Z_3$, a readout of magnetic resonance signals takes place during a readout window W. For this purpose, a gradient pulse $Gx_2$ is switched on the x-gradient axis.

FIG. 4 shows the sequence diagram of the magnetic resonance sequence of FIG. 3. In this case, in the further method step 203, fixed point time intervals $I_F$ and modifiable time intervals $I_O$ have been identified within the magnetic resonance sequence. The non-optimizable fixed point time intervals $I_F$ are each covered by a diagonally striped pattern. The modifiable time intervals $I_O$ are not covered by a diagonally striped pattern.

The fixed point time intervals $I_F$ are herein the time intervals which do not fall within the criteria described above which identify a time interval as a non-optimizable fixed point time interval $I_F$. Thus, the first time interval $Z_1$ is a fixed point time interval $I_F$, since during the first time interval $Z_1$ a radio frequency pulse RF is emitted. The third time interval $Z_3$ is also a fixed point time interval $I_F$, since during the third time interval $Z_3$, a readout window W is switched. The second time interval $Z_2$ has been identified for all the gradient axes Gx, Gy, Gz as a modifiable time interval $I_O$ of the analysis unit 33, since during this interval, no radio frequency pulse RF and no readout window W takes place and the flow compensation gradient pulses $Gx_1$, $Gy_1$, $Gz_2$ may be optimized by the optimizing unit 34, taking account of the first moment of the flow compensation gradient pulses $Gx_1$, $Gy_1$, $Gz_2$.

In the modifiable time intervals $I_O$, the gradient pulses, in particular the gradient shape of the gradient pulses, may be varied as desired under the following limit conditions: at the border points to the adjoining time intervals which do not contain optimizable fixed point time intervals $I_F$, the gradient amplitudes are advantageously constant. Furthermore, at the border points to the adjoining fixed point time intervals $I_F$, the rise of the gradient amplitudes will advantageously be set to zero. Furthermore, the zeroth moment and the first moment of the gradient pulses in the respective optimizable time intervals $I_O$ before and after the optimization will advantageously be equal. Alternatively, the first moment can be set to a predetermined value. Naturally, deviating limit conditions which appear useful to those skilled in the art for optimizing the gradient pulses can also be set. A limit condition should take account of a first moment of at least one gradient pulse.

FIG. 5 shows the sequence diagram of the magnetic resonance sequence of FIGS. 3 and 4 following the optimization of the magnetic resonance sequence by the optimizing unit 34 of the sequence optimizing unit 30.

In the example shown, the modifiable time intervals $I_O$ were optimized under the stated limit conditions, in particular, separately for the three gradient axes Gx, Gy, Gz, wherein the gradient pulses are given by FIG. 5. The optimization herein takes place using a fifth order spline interpolation method, wherein the amplitude values at the limits are each regarded as fixed points and a spline leads, under the stated limit conditions (reaching the fixed points, setting to zero the first derivative of the gradient shape at the fixed points and keeping the integral under the gradient shape and the first moment of the gradient pulses constant) to a desired smooth gradient pulse in the respective optimizable time intervals $I_O$. Other optimization methods that appear useful to those skilled in the art are also conceivable.

In a comparison between FIG. 3 and FIG. 4, it is readily apparent that the optimized flow compensation gradient pulses $Gx_1'$, $Gy_1'$, $Gz_2'$ are relatively smooth and therefore they cause significantly less loading on the gradient coils and reduce the noise nuisance.

It should also be noted that the optimized flow compensation gradient pulses $Gx_1'$, $Gy_1'$, $Gz_2'$ each have a negative partial region with a negative gradient amplitude and a positive partial region with a positive gradient amplitude. This is a consequence of taking account of the first moment of the flow compensation gradient pulses $Gx_1'$, $Gy_1'$, $Gz_2'$ during the optimization.

In particular, it should be noted that the gradient amplitude of the gradient pulse $Gz_1'$ during the first time interval $Z_1$, during which a slice-selective radio frequency pulse HF is emitted has not changed. This means that in this first time range $Z_1$ the gradient shape of the original gradient pulse $Gz_1$ in FIG. 3 corresponds to the gradient shape of the gradient pulse $Gz_1'$ of FIG. 5. The same applies for the gradient pulse $Gx_2'$, which occurs during the third time interval $Z_3$ with the readout window W. The gradient pulse $Gx_2$ of FIG. 3 is therefore identical to the gradient pulse $Gx_2'$ of FIG. 5.

From FIGS. 3 and 5, it can be seen how, with the optimization of the gradient pulses according to the embodiment of the method according to the invention, each magnetic resonance sequence can be optimized by effective means very rapidly immediately before the playing out with regard to the noise nuisance and the loading of the gradient coils.

As an example, taking the optimized y-flow compensation gradient pulse $Gy1'$, which occurs in the time interval $Z_2$ with the first interval boundary T1 and the second interval boundary T2, further possible limit conditions for the fifth order spline interpolation method for the calculation of the gradient shape of the y-flow compensation gradient pulse $Gy_1'$ are given here.

i) holding constant the gradient amplitude G1 of the y-flow compensation gradient pulse $Gy_1'$ at the first interval boundary T1, ii) holding constant the gradient amplitude G2 of the y-flow compensation gradient pulse $Gy_1$ at the second interval boundary T2, iii) setting the derivative of the y-flow compensation gradient pulse $Gy_1'$ to zero at the first interval boundary T1, iv) setting the derivative of the y-flow compensation gradient pulse $Gy_1'$ to zero at the second interval boundary T2, v) holding constant the zeroth moment M0 of the y-flow compensation gradient pulse $Gy_1'$ and vi) holding constant the first moment M1 y-flow compensation gradient pulse $Gy_1'$.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for optimizing a magnetic resonance data acquisition sequence for operating a magnetic resonance apparatus, comprising:

providing a selected magnetic resonance sequence to a computer, said selected magnetic resonance sequence comprising a plurality of fixed point time intervals that are to be left unaltered and a plurality of modifiable time intervals that may be optimized;

in said computer, automatically analyzing said selected magnetic resonance sequence to identify the fixed point time intervals therein and the modifiable time intervals therein;

in said computer, automatically optimizing at least one gradient pulse that occurs during at least one modifiable time intervals among said plurality of modifiable time intervals, by automatically optimizing said at least one gradient pulse by keeping a first moment of said at least one gradient pulse constant, said first moment of said at least one gradient pulse being an integral of a product of a gradient amplitude of said at least one gradient pulse and a duration of said at least one gradient pulse, thereby producing an optimized magnetic resonance sequence;

making said optimized magnetic resonance sequence available as an electronic signal at an output of said computer in a form configured to operate a magnetic resonance data acquisition scanner; and operating the magnetic resonance data acquisition scanner with said optimized magnetic resonance sequence, including operating a gradient coil arrangement with said at least one gradient pulse, in order to acquire magnetic resonance data from a subject, and making the acquired magnetic resonance data available from the computer in electronic form, as a data file.

2. A method as claimed in claim 1 wherein said at least one gradient pulse is configured as a flow compensation gradient pulse.

3. A method as claimed in claim 1 wherein said selected magnetic resonance sequence comprises measurement parameters that include a predetermined first moment for said at least one gradient pulse and comprising optimizing said at least one gradient pulse by keeping said first moment of said optimized gradient pulse set to said predetermined first moment.

4. A method as claimed in claim 1 comprising optimizing said at least one gradient pulse using a spline interpolation technique.

5. A method as claimed in claim 4 comprising optimizing said at least one gradient pulse using a fifth order spline optimization technique.

6. A method as claimed in claim 1 comprising, in said computer, identifying a time range within said selected magnetic resonance sequence as being a fixed point time interval when, in said selected magnetic resonance sequence at least one event occurs within that time range, selected from the group of events consisting of emission of a radio-frequency pulse, readout of raw data, switching of a diffusion gradient pulse, and switching of a knocking gradient pulse.

7. A method as claimed in claim 1 comprising identifying a time range within said selected magnetic resonance sequence as being either a fixed point time interval or a modified time interval by an analysis selected from the group consisting of analysis of radio-frequency pulse transmission times, analysis of readout times, analysis of gradient shape, and analysis of identifiers contained in a parameter set of said selected magnetic resonance sequence.

8. A method as claimed in claim 1 comprising optimizing said at least one gradient pulse by keeping a zeroth moment of said at least one gradient pulse constant.

9. A method as claimed in claim 1 comprising optimizing said at least one gradient pulse by keeping a gradient amplitude of said at least one gradient pulse constant at fixed points of said amplitude.

10. A method as claimed in claim 9 comprising employing, as said fixed points, at least two limit values respectively at interval boundaries of the at least one modifiable time interval in which said at least one gradient pulse occurs, with respect to neighboring fixed point time intervals.

11. A method as claimed in claim 1 comprising optimizing said at least one gradient pulse by setting a rise of a gradient amplitude of said at least one gradient pulse to zero at fixed points of said gradient amplitude.

12. A method as claimed in claim 11 comprising employing, as said fixed points, at least two limit values respectively at interval boundaries of the at least one modifiable time interval in which said at least one gradient pulse occurs, with respect to neighboring fixed point time intervals.

13. A magnetic resonance apparatus comprising:

a computer;

a magnetic resonance data acquisition unit;

said computer comprising an input interface that receives a selected magnetic resonance sequence, said selected magnetic resonance sequence comprising a plurality of fixed point time intervals that are to be left unaltered and a plurality of modifiable time intervals that may be optimized;

said computer being configured to automatically analyze said selected magnetic resonance sequence to identify the fixed point time intervals therein and the modifiable time intervals therein;

said computer being configured to automatically optimize at least one gradient pulse that occurs during at least one modifiable time intervals among said plurality of modifiable time intervals, by automatically optimizing said at least one gradient pulse by keeping a first moment of said at least one gradient pulse constant, said first moment of said at least one gradient pulse being an integral of a product of a gradient amplitude of said at least one gradient pulse and a duration of said at least one gradient pulse, thereby producing an optimized magnetic resonance sequence; and said computer being configured to operate said magnetic resonance data acquisition unit according to said optimized magnetic resonance sequence in order to acquire magnetic resonance data from a subject, and to make the acquired magnetic resonance data available from the computer in electronic form as a data file.

14. A non-transitory, computer-readable data storage medium encoded with programming instructions, said storage medium being loaded into a computer and said programming instructions causing said computer to:

receive a selected magnetic resonance sequence, said selected magnetic resonance sequence comprising a plurality of fixed point time intervals that are to be left unaltered and a plurality of modifiable time intervals that may be optimized;

automatically analyze said selected magnetic resonance sequence to identify the fixed point time intervals therein and the modifiable time intervals therein;

automatically optimize at least one gradient pulse that occurs during at least one modifiable time intervals among said plurality of modifiable time intervals, by automatically optimizing said at least one gradient pulse by keeping a first moment of said at least one gradient pulse constant, said first moment of said at least one gradient pulse being an integral of a product of a gradient amplitude of said at least one gradient pulse and a duration of said at least one gradient pulse, thereby producing an optimized magnetic resonance sequence;

make said optimized magnetic resonance sequence available as an electronic signal at an output of said computer in a form configured to operate a magnetic resonance data acquisition scanner; and operate the magnetic resonance data acquisition scanner with said optimized magnetic resonance sequence, including operating a gradient coil arrangement with said at least one gradient pulse, in order to acquire magnetic resonance data from a subject, and make the acquired magnetic resonance data available from the computer in electronic form, as a data file.

* * * * *